United States Patent [19]

Wells

[11] 3,961,947

[45] June 8, 1976

[54] PROCESS FOR PREPARING WATERLESS LITHOGRAPHIC MASTERS

[75] Inventor: John B. Wells, Savannah, N.Y.

[73] Assignee: Xerox Corporation, Stamford, Conn.

[22] Filed: Oct. 19, 1973

[21] Appl. No.: 408,222

[52] U.S. Cl. .................. 96/1 R; 96/33; 96/36.3; 101/463; 427/258; 427/302; 427/342

[51] Int. Cl.² .................. G03F 7/02

[58] Field of Search .................. 96/33, 1 R, 36.3; 101/463; 427/258, 302, 342

[56] References Cited

UNITED STATES PATENTS

| | | | |
|---|---|---|---|
| 3,215,527 | 11/1965 | Johnson | 96/33 |
| 3,287,152 | 11/1966 | Alles et al. | 96/115 R |
| 3,385,699 | 5/1968 | Honjio | 96/1 R |
| 3,511,178 | 5/1970 | Curtin | 96/33 |
| 3,677,178 | 7/1972 | Gipe | 96/33 |
| 3,775,115 | 11/1973 | Sorkin et al. | 96/33 |
| 3,869,285 | 3/1975 | Kondo et al. | 96/33 |

*Primary Examiner*—J. Travis Brown
*Attorney, Agent, or Firm*—James J. Ralabate; James P. O'Sullivan; Donald M. MacKay

[57] ABSTRACT

A novel method of preparing a waterless lithographic master and a method of printing therefrom are provided. To prepare the printing master, a suitable ink accepting substrate such as aluminum, paper or plastic, is coated with a silicone gum curing catalyst, preferably suspended in a hydrophilic binder. A barrier fusable particulate hydrophobic image pattern is then deposited on said coated substrate and fused to mask said curing catalyst in the image areas. The substrate is then coated with an uncured silicone gum, preferably as an aqueous emulsion so that the gum does not adhere to the hydrophobic image pattern. The silicone gum is then cured in the nonimage areas to selectively provide ink receptive image areas and ink releasing nonimage areas. The method of printing comprises the additional steps of applying ink to the imaged master and contacting the inked master with an image receiving surface to thereby transfer the inked image.

28 Claims, No Drawings

PROCESS FOR PREPARING WATERLESS LITHOGRAPHIC MASTERS

BACKGROUND OF THE INVENTION

It has recently been discovered that the need for a fountain solution on a printing press can be obviated if the master is coated in the nonimage areas with a silicone elastomer which is ink releasing. A number of difficulties have been encountered, in electrophotographic imaging of silicone elastomers. Fro example, by reason of their abhesive or nonadhesive character, it has been difficult to adhere toner particles to the silicone in order to provide an image pattern.

BRIEF DESCRIPTION OF THE INVENTION

It has now been discovered that the aforesaid defect can be obviated and printing masters having long image lives prepared. In addition, it has been found that the master can be imaged, so that the silicone elastomer does not adhere to the image, to provide ink receptive image areas and ink releasing background areas which are durable and long lasting.

More particularly, the novel process comprises coating a suitable substrate such as paper, with a silicone gum curing catalyst, preferably in a hydrophilic binder such as gelatin. A barrier fusible particulate image pattern, preferably a hydrophobic image pattern, is then deposited on said coated substrate and fused to mask the catalyst in the image areas. Then an uncured silicone gum, preferably as an aqueous emulsion, is coated on the substrate. Because of the hydrophobic nature of the image pattern, very little silicone gum, if any, remains on the image because it is nonwetted when the silicone gum is applied as an aqueous emulsion. Consequently, when the silicone gum is cured, it is cured only in the nonimage areas to selectively provide ink receptive image areas and ink releasing areas. When the silicone gum coating solution is nonaqueous or the toner wetted by the coating solution, the gum is deposited on the image pattern. After curing of the gum in the nonimage areas, the uncured gum, particulate image pattern and curing catalyst can be removed by a solvent, and printing accomplished from the imaged ink accepting substrate.

As an alternative embodiment, an ink receptive substrate can be first coated with an uncured gum, and the fusible particulate image pattern deposited thereon and fused. The catalyst for the gum is then deposited and the gum is cured in the nonimage areas. The particulate image pattern serves as a mask which prevents the catalyst and silicone gum from combining in the image areas. Accordingly, follwing curing of the silicone gum in the nonimage areas, the uncured silicone gum, curing catalyst and particulate image pattern can be removed in the imaged areas by an appropriate solvent, and printing accomplished from the hydrophobic ink accepting master substrate.

DETAILED DESCRIPTION OF THE INVENTION

Substrates which can be employed to prepare the printing master are self-supporting materials to which the silicone can be adhered and which possess sufficient heat and mechanical stability to permit use under widely varying printing and handling conditions, and which are preferably ink accepting. Exemplary of suitable materials are paper; metals such as aluminum; and plastics such as polyester, polycarbonate, polysulfone, nylon and polyurethane.

The silicone gums which can be employed to coat the substrate are the conventional types employed heretofore in waterless lithography, which have reactive crosslinking sites or are capable of being cured to an ink releasable elastomeric condition. Exemplary of suitable silicone gums are those having only methyl containing groups in the polymer chain such as polydimethylsiloxane; gums having both methyl and phenyl containing groups in the polymer chain as well as gums having both methyl and vinyl groups, methyl and fluorine groups, or methyl, phenyl and vinyl groups in the polymer chain.

Typical silicone gums which are of the heat curing or thermally curable type suitable for use in the invention are Syl Gard No. 182, Syl Off 22 and 23 manufactured by Dow Corning, Midland, Michigan; Y-3557 and Y-3602 silicone gum available from Union Carbide Company, New York, N.Y., as well as No. 4413 silicone and No. 4427 heat curable silicone gums available from General Electric Company, Waterford, N.Y. The Y-3557 and Y-3602 gums specifically have aminoalkane crosslinking sites in the polymer backbone which react with a diisocyanate crosslinking agent over a wide range of temperature and time to produce a durable, ink releasable elastomeric film.

The catalyst employed will depend on the type of gum employed as is well known to those skilled in the art. Suitable catalysts for the silicone gums of the conventional type which have been heretofore employed include the tin catalysts such as stannous octoate and dibutyl tin dilaurate. Diaroyl peroxides such as dibenzoyl peroxide, di-p-chlorobenzoyl peroxide and bis-2,4-dichlorobenzoyl peroxide can be employed. Other catalysts include the dialkyl peroxides such as di-t-butyl peroxide and 2,5-dimethyl-2,5-di-(t-butylperoxy)-hexane. Diaralkyl peroxides such as dicumyl peroxide, and alkyl aralkyl peroxides such as t-butyl cumyl peroxide can be employed, as well as blocked disocyantes.

The catalyst is preferably applied with a hydrophilic binder. Exemplary of suitable hydrophilic binders are gelatin, starch, polyvinyl alcohol or a cellulose such as methyl, ethyl, propyl or butyl cellulose. Only a minor amount of catalyst is required. Generally from about 1 to 2 percent by weight of the gum is sufficient. The binder need only be employed in an amount to dissolve or disperse the catalyst and render the substrate hydrophilic so that the silicone gum can more easily adhere thereto.

The particulate image pattern can be deposited on the substrate in the conventional manner such as by electrostatographic means such as xerography. It is preferred when the gum is first applied to the substrate that the latent image be formed, developed and transferred to an intermediate sheet before being transferred to the silicone gum. In this manner, a more clearly defined image is obtained than when the developed image is transferred directly from the processor to the silicone gum. The conventional toners can be employed to form the barrier particulate image pattern which typically are thermoplastic materials such as polymers of styrene, vinyl chloride and the like in combination with a pigment such as carbon black. Exemplary of suitable styrene polymers are: polystyrene, styrene-n-butylmethacrylate copolymer and styrene-butadiene copolymer. A numer of particulate materials can be employed as it is only necessary that the material serve as a barrier or mask to prevent the silicone gum and catalyst from reacting in the image areas.

The particulate image pattern can be fused in the conventional manner such as in Xerox heat or vapor fuser but preferably a vapor fuser is employed when using a catalyst which is thermally degradable or volatile.

Curing of the silicone gum from its gummy or tacky state to an elastomeric ink releasable condition, can be obtained by conventional means. For example, heat or actinic radiation can be employed.

After the polymer is cured to an elastomeric ink releasable condition, the master can be mounted on a lithographic printing press with the dampening system removed, whereupon during printing the particles from the particulate image pattern, and the uncured silicone gum below said image pattern will gradually be abraded or dissolved away. Alternatively, the toner can be removed before being mounted on the press by treating the master with a solvent such as acetone, benzene, toluene or other hydrocarbon in which the uncured silicone gum and toner are soluble to reveal an ink accepting substrate.

Typical inks can be employed in the printing method of the invention which have been used in waterless lithographic printing from silicone masters. Typical inks include inks of the rubber or oleophilic type having the vehicle component for the ink pigments derived from various oleophilic materials such as aromatic and aliphatic hydrocarbons, drying oil varnishes, lacquers, and solvent type resins.

The master can be employed in the direct or offset printing modes. When the master is employed in the direct mode, the substrate should be made of a resilient material such as a polyurethane.

The following examples will serve to illustrate the invention. All parts and percentages in said examples and elsewhere in the specification and claims are by weight unless otherwise specified.

EXAMPLE I

A silicone catalyst (in a ratio of one part by volume aqueous catalyst per five parts aqueous rubber, i.e. Dow Corning 22A) was coated to a thickness of 5 to 10 microns on a grained aluminum plate (10 inches × 15 inches) employing a cotton pad applicator. The plate was exposed to ambient conditions for approximately 15 hours to allow for vehicle evaporation and partially dry the gum. Thereafter, using a Xerox Model D processor, a latent electrostatic test image containing line copy was formed and cascade developed with Xerox 2400 toner. The developed image was transferred from the photoconductive surface of the processor to a sheet of paper coated with a Teflon spray. The sheet with the developed image was contacted with the catalyst treated aluminum plate and the developed image electrostatically transferred to the aluminum plate. The toner image was then vapor cured by placing the sheet in a Xerox vapor fuser for seven seconds employing trichlorethylene. The resultant fused image plate was coated with an aqueous silicone emulsion (Dow Corning — 22) employing a cotton pad applicator. The plate was then placed in an air oven and heated at 170°C for 1 minute. The plate was removed from the oven and the catalyst, toner, and uncured silicone removed by wiping with a cotton pad of acetone. The plate was inked with VanSon PMS blank ink. Clear prings were obtained from this plate. The plate was mounted on a Davidson lithographic press in a direct mode and 150 clear prints were made on Xerox 1524 paper employing Ron Inc Co. driographic ink.

EXAMPLE II

The procedure of Example I was repeated but with the exception that a paper master was substituted for the grained aluminum substrate of Example I. A number of clear prints were obtained from the resultant plate.

EXAMPLE III

The procedure of Example I is repeated but with the exception that the silicone gum is first coated on the aluminum substrate, the particulate image applied and then the silicone catalyst coated over the imaged plate.

Having described the present invention with reference to these specific embodiments, it is to be understood that numerous variations can be made without departing from the spirit of the invention and it is intended to include such reasonable variations and equivalents within the scope.

What is claimed is:

1. A method of preparing a waterless lithographic master comprising:
- a. providing a suitable ink accepting substrate,
- b. coating said substrate with a silicone gum curing catalyst,
- c. depositing a barrier fusible hydrophobic particulate image pattern on said coated substrate to mask said curing catalyst in the image areas,
- d. fusing said particulate image pattern,
- e. coating the resultant substrate with a curable silicone gum as an aqueous emulsion; and
- f. curing said silicone gum in the nonimage areas to selectively provide ink receptive image areas and ink releasing nonimage areas.

2. A method of preparing a waterless lithographic master comprising:
- a. providing a suitable ink accepting substrate,
- b. coating said substrate with a silicone gum curing catalyst,
- c. depositing a barrier fusible particulate image pattern on said coated substrate to mask said curing catalyst in the image areas,
- d. fusing said particulate image pattern,
- e. coating the resultant substrate with a curable silicone gum; and
- f. curing said silicone gum in the nonimage areas and removing the uncured gum, curing catalyst and particulate image pattern to selectively provide ink receptive image areas and ink releasing nonimage areas.

3. The process of claim 1 wherein the substrate of (a) comprises an ink receptive resilient material.

4. The process of claim 1 wherein the particulate image pattern is fused by solvent vapor.

5. The process of claim 1 wherein the particulate image pattern is fused by heat.

6. The process of claim 1 wherein the silicone gum is cured by heat.

7. The process of claim 1 wherein the particulate image pattern is deposited on a substrate and transferred to the coated substrate of step (c).

8. A method of preparing a waterless lithographic master comprising:
- a. providing a suitable ink accepting hydrophilic substrate, b. coating said substrate with a silicone gum curing catalyst in a hydrophilic binder, c. depositing a fusible particulate hydrophobic image pattern on said coated substrate, d. fusing said particulate image pattern, e. coating the resultant substrate with an aqueous curable silicone gum emulsion, and f. curing said silicone gum emulsion to selectively provide ink receptive image areas and ink releasing nonimage areas.

9. The process of claim 8 wherein the substrate of (a) comprises an ink receptive resilient material.

10. The process of claim 8 wherein the particulate image pattern is fused by solvent vapor.

11. The process of claim 8 wherein the particulate image pattern is fused by heat.

12. The process of claim 8 wherein the silicone gum is cured by heat.

13. The process of claim 8 wherein the particulate image pattern is deposited on a substrate and transferred to the coated substrate of step (c).

14. A method of preparing a waterless lithographic master comprising:

a. coating a suitable substrate with a curable silicone gum, b. depositing a barrier fusible particulate image pattern on said coated substrate, c. fusing said particulate image pattern, d. coating the resultant substrate with a silicone gum curing catalyst, and e. curing said silicone gum in the nonimage areas to selectively provide ink receptive image areas and ink releasing nonimage areas, and removing the uncured gum, particulate image pattern and curing catalyst in the image areas.

15. The process of claim 14 wherein the substrate of (a) comprises an ink receptive resilient material.

16. The process of claim 14 wherein the particulate image pattern is fused by solvent vapor.

17. The process of claim 14 wherein the particulate image pattern is fused by heat.

18. The process of claim 14 wherein the silicone gum is cured by heat.

19. The process of claim 14 wherein the particulate image pattern is deposited on a substrate and transferred to the coated substrate of step (c).

20. A method of printing with the master of claim 1 wherein following curing of the silicone to selectively provide ink receptive areas and ink releasing nonimage areas, ink is applied to said ink receptive image areas and the master contacted with an image receiving surface to thereby transfer the inked image.

21. A method of printing with the master of claim 1 wherein following curing of the silicone and removal of the uncured gum, catalyst and particulate image pattern to selectively provide ink receptive areas and ink releasing nonimage areas, ink is applied to said ink receptive image areas and the master contacted with an image receiving surface to thereby transfer the inked image.

22. A method of printing with the master of claim 6 wherein following curing, ink is applied to said ink receptive image areas and the master contacted with an image receiving surface to thereby transfer the inked image.

23. A method of printing with the master of claim 11 wherein following curing of the silicone to selectively provide ink receptive areas and ink releasing nonimage areas, ink is applied to said ink receptive image areas and the master contacted with an image receiving surface to thereby transfer the inked image.

24. A method of printing with the master of claim 11 wherein following curing of the silicone and removal of the uncured gum, catalyst and particulate image pattern to selectively provide ink receptive areas and ink releasing nonimage areas, ink is applied to said ink receptive image areas and the master contacted with an image receiving surface to thereby transfer the inked image.

25. The method of claim 1 wherein the image is electrophotographically formed.

26. The method of claim 2 wherein the image is electrophotographically formed.

27. The method of claim 8 wherein the image is electrophotographically formed.

28. The method of claim 14 wherein the image is electrophotographically formed.

* * * * *